United States Patent
Moriyama et al.

(10) Patent No.: US 9,647,038 B2
(45) Date of Patent: *May 9, 2017

(54) SOLID-STATE IMAGING DEVICE AND METHOD OF MANUFACTURING THE SAME

(71) Applicant: PANASONIC INTELLECTUAL PROPERTY MANAGEMENT CO., LTD., Osaka (JP)

(72) Inventors: Yoshiya Moriyama, Osaka (JP); Hiromasa Fujimoto, Osaka (JP); Kosaku Saeki, Osaka (JP); Nobuyoshi Takahashi, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,861

(22) Filed: Jun. 28, 2016

(65) Prior Publication Data
US 2016/0307967 A1 Oct. 20, 2016

Related U.S. Application Data

(60) Division of application No. 14/554,027, filed on Nov. 25, 2014, now Pat. No. 9,406,722, which is a
(Continued)

(30) Foreign Application Priority Data

Jun. 28, 2012 (JP) .................................. 2012-145946

(51) Int. Cl.
*H01L 21/00* (2006.01)
*H01L 27/30* (2006.01)
(Continued)

(52) U.S. Cl.
CPC .......... *H01L 27/307* (2013.01); *H01L 21/265* (2013.01); *H01L 27/14612* (2013.01);
(Continued)

(58) Field of Classification Search
CPC ............. H01L 27/307; H01L 27/14612; H01L 27/14636; H01L 27/14665; H01L 29/42376
See application file for complete search history.

(56) References Cited

U.S. PATENT DOCUMENTS 7,605,415 B2   10/2009   Koizumi et al.
7,920,192 B2    4/2011   Watanabe et al.
(Continued)

FOREIGN PATENT DOCUMENTS

JP   2007-059467 A   3/2007
JP   2008-041726 A   2/2008
(Continued)

OTHER PUBLICATIONS

International Search Report dated Aug. 13, 2013 in corresponding International Patent Application No. PCT/JP2013/003489.
(Continued)

*Primary Examiner* — Nicholas Tobergte
(74) *Attorney, Agent, or Firm* — McDermott Will & Emery LLP

(57) ABSTRACT

A solid-state imaging device includes: a semiconductor substrate; a pixel unit formed on the semiconductor substrate; and a peripheral circuit unit formed on the semiconductor substrate, at a periphery of the pixel unit, in which the pixel unit includes: a photoelectric conversion film which converts incident light into charges; and a floating diffusion which holds the charges, the peripheral circuit unit includes a transistor including a gate electrode and two source and drain diffusion regions, and the two source and drain diffu-
(Continued)

sion regions have a higher impurity concentration than an impurity concentration of the floating diffusion.

14 Claims, 11 Drawing Sheets

Related U.S. Application Data continuation of application No. PCT/JP2013/003489, filed on Jun. 3, 2013.

(51) Int. Cl.
    *H01L 27/146*    (2006.01)
    *H01L 21/265*    (2006.01)
    *H01L 29/08*     (2006.01)
    *H01L 29/423*    (2006.01)
    *H01L 21/324*    (2006.01)

(52) U.S. Cl.
    CPC .. *H01L 27/14636* (2013.01); *H01L 27/14665* (2013.01); *H01L 27/14687* (2013.01); *H01L 27/14689* (2013.01); *H01L 29/0847* (2013.01); *H01L 29/42376* (2013.01); *H01L 21/324* (2013.01)

(56) References Cited

U.S. PATENT DOCUMENTS

| | | | |
|---|---|---|---|
| 8,411,187 B2 | 4/2013 | Watanabe et al. | |
| 8,525,909 B2 | 9/2013 | Matsumoto et al. | |
| 8,928,784 B2 | 1/2015 | Watanabe et al. | |
| 9,406,722 B2 * | 8/2016 | Moriyama | ........ H01L 27/14665 |
| 2005/0205903 A1 | 9/2005 | Hioki | |
| 2007/0045520 A1 | 3/2007 | Mitsui | |
| 2008/0029793 A1 | 2/2008 | Watanabe et al. | |
| 2010/0026866 A1 | 2/2010 | Matsumoto et al. | |
| 2010/0133592 A1 | 6/2010 | Mori et al. | |
| 2010/0149392 A1 | 6/2010 | Hara | |
| 2010/0271523 A1 | 10/2010 | Hara | |
| 2010/0320517 A1 | 12/2010 | Okagawa | |
| 2011/0003426 A1 | 1/2011 | Watanabe et al. | |
| 2011/0157447 A1 | 6/2011 | Watanabe et al. | |
| 2011/0220778 A1 | 9/2011 | Inaba | |
| 2013/0285131 A1 | 10/2013 | Matsumoto et al. | |
| 2014/0027617 A1 | 1/2014 | Amikawa | |
| 2014/0111676 A1 | 4/2014 | Koyama et al. | |

FOREIGN PATENT DOCUMENTS

| | | |
|---|---|---|
| JP | 2008-053366 A | 3/2008 |
| JP | 2010-056515 A | 3/2010 |
| JP | 2011-187725 A | 9/2011 |
| JP | 2011-233908 A | 11/2011 |
| JP | 2011-243851 A | 12/2011 |
| JP | 2011-258613 A | 12/2011 |
| JP | 2012-019169 A | 1/2012 |

OTHER PUBLICATIONS

Non-Final Office Action issued in related U.S. Appl. No. 14/554,027, mailed on Dec. 22, 2015.
Office Action issued in corresponding Japanese Patent Application No. 2014-522395, mailed on Mar. 14, 2017.

\* cited by examiner

SOLID-STATE IMAGING DEVICE AND METHOD OF MANUFACTURING THE SAME

CROSS REFERENCE TO RELATED APPLICATIONS

This is a Divisional Application of U.S. patent application Ser. No. 14/554,027, filed on Nov. 25, 2014, now U.S. Pat. No. 9,406,722, which in turn is a continuation application of PCT International Application No. PCT/JP2013/003489 filed on Jun. 3, 2013, designating the United States of America, which is based on and claims priority of Japanese Patent Application No. 2012-145946 filed on Jun. 28, 2012. The entire disclosures of the above-identified applications, including the specifications, drawings and claims are incorporated herein by reference in their entirety.

FIELD

The present disclosure relates to a solid-state imaging device and a method of manufacturing the solid-state imaging device.

BACKGROUND

A metal oxide semiconductor (MOS) image sensor includes a pixel unit formed on a semiconductor substrate and including a photoelectric conversion unit for converting incident light into an electric signal and a peripheral circuit unit formed at the periphery of the pixel unit. In a solid-state imaging device such as the MOS image sensor, a demand for the peripheral circuit unit to operate at a high speed has been increasing in recent years. In accordance with this trend, a demand for the miniaturization of a MOS transistor included in the peripheral circuit unit has been increasing (e.g., Patent Literature 1 (PTL 1)).

Moreover, Patent Literature 2 (PTL 2) suggests a new image sensor (stacked image sensor) including a photoelectric conversion element (a photoelectric conversion film) formed on wiring rather than on a silicon substrate.

CITATION LIST

Patent Literature

[PTL 1] Japanese Unexamined Patent Application Publication No. 2010-056515
[PTL 2] Japanese Unexamined Patent Application Publication No. 2012-019169

SUMMARY

Technical Problem

The following describes a configuration of a solid-state imaging device. FIG. 21 is a cross-sectional view of a pixel unit 150 included in the solid-state imaging device. The pixel unit 150 includes a select transistor 121, an amplification transistor 122, a reset transistor 123, a transfer transistor 124, and a photodiode 125. The select transistor 121, the amplification transistor 122, the reset transistor 123, and the transfer transistor 124 are separated by element isolation regions 102 formed on the surface of a semiconductor substrate 101.

FIG. 22 is a cross-sectional view of a peripheral circuit unit 160 included in the solid-state imaging device. The peripheral circuit unit 160 includes an NchMOS transistor 126 and a PchMOS transistor 127. The NchMOS transistor 126 and the PchMOS transistor 127 are separated by the element isolation region 102 formed on the surface of the semiconductor substrate 101.

The select transistor 121 illustrated in FIG. 21 includes a gate insulating film 103A, a gate electrode 104A, sidewalls 109A, two N-type lightly doped drain (LDD) diffusion regions 106A, and two N-type source and drain diffusion regions 107A. Here, the gate insulating film 103A is formed on the semiconductor substrate 101. The gate electrode 104A is formed on the gate insulating film 103A. The sidewalls 109A are formed on the side faces of the gate electrode 104A. The two N-type LDD diffusion regions 106A and the two N-type source and drain diffusion regions 107A are formed on the surface of the semiconductor substrate 101. Moreover, the two N-type LDD diffusion regions 106A are formed on opposite sides of the gate electrode 104A. The N-type source and drain diffusion regions 107A are formed one on either side of the sidewalls 109A sandwiching the gate electrode 104A.

The amplification transistor 122 includes a gate insulating film 103B, a gate electrode 104B, sidewalls 109B, two N-type LDD layers 106B, and two N-type source and drain diffusion regions 107B. Here, the gate insulating film 103B is formed on the semiconductor substrate 101. The gate electrode 104B is formed on the gate insulating film 103B. The sidewalls 109B are formed on the side faces of the gate electrode 104B. The two N-type LDD diffusion regions 106B and the two N-type source and drain diffusion regions 107B are formed on the surface of the semiconductor substrate 101. Moreover, the two N-type LDD diffusion regions 106B are formed on opposite sides of the gate electrode 104B. The two N-type source and drain diffusion regions 107B are formed one on either side of the sidewalls 109B sandwiching the gate electrode 104B.

The reset transistor 123 includes a gate insulating film 103C, a gate electrode 104C, sidewalls 109C, two N-type LDD diffusion regions 106C, and two N-type source and drain diffusion regions 107C. Here, the gate insulating film 103C is formed on the semiconductor substrate 101. The gate electrode 104C is formed on the gate insulating film 103C. The sidewalls 109C are formed on the side faces of the gate electrode 104C. The two N-type LDD diffusion regions 106C and the two N-type source and drain diffusion regions 107C are formed on the surface of the semiconductor substrate 101. Moreover, the two N-type LDD diffusion regions 106C are formed on opposite sides of the gate electrode 104C. The two N-type source and drain diffusion regions 107C are formed one on either side of the sidewalls 109C sandwiching the gate electrode 104C.

The transfer transistor 124 includes a gate insulating film 103D, a gate electrode 104D, sidewalls 109D, an N-type LDD diffusion region 106D, an N-type source and drain diffusion region 107D, and an N-type buried diffusion region 108. The gate insulating film 103D is formed on the semiconductor substrate 101. The gate electrode 104D is formed on the gate insulating film 103D. The sidewalls 109D are formed on the side faces of the gate electrode 104D. The N-type LDD diffusion region 106D is formed on one side of the gate electrode 104D. The N-type source and drain diffusion region 107D is formed on either side of the sidewalls 109D. The N-type buried diffusion region 108 is formed on the opposite side of the gate electrode 104D. It should be noted that the N-type buried diffusion region 108 also functions as the photodiode 125. Moreover, the N-type LDD diffusion region 106D, the N-type source and drain diffusion region 107D, and an N-type buried diffusion region 108 are formed on the surface of the semiconductor substrate 101.

Here, the photodiode 125 is a photoelectric conversion unit for converting incident light into an electric signal (charges). Moreover, the N-LDD diffusion regions 106C, the N-type source and drain diffusion regions 107C, the N-LDD diffusion region 106D, and the N-type source and drain diffusion region 107D function as floating diffusions which hold charges generated in the photodiode 125 and transferred via the transfer transistor 124.

The NchMOS transistor 126 illustrated in FIG. 22 includes a gate insulating film 133E, a gate electrode 104E, sidewalls 109E, two N-type extension diffusion regions 134, and two N-type source and drain diffusion regions 136. Here, the gate insulating film 133E is formed on the semiconductor substrate 101. The gate electrode is formed on the gate insulating film 133E. The sidewalls 109E are formed on the side faces of the gate electrode 104E. The two N-type extension diffusion regions 134 and the two N-type source and drain diffusion regions 136 are formed on the surface of the semiconductor substrate 101. Moreover, the two N-type extension diffusion regions 134 are formed on opposite sides of the gate electrode 104E. The two N-type source and drain diffusion regions 136 are formed one on either side of the sidewalls 109E sandwiching the gate electrode 104E.

The PchMOS transistor 127 includes a gate insulating film 133F, a gate electrode 104F, sidewalls 109F, two P-type extension diffusion regions 135, and two P-type source and drain diffusion regions 137. Here, the gate insulating film 133F is formed on the semiconductor substrate 101. The gate electrode 104F is formed on the gate insulating film 133F. The sidewalls 109F are formed on the side faces of the gate electrode 104F. The two P-type extension diffusion regions 135 and the two P-type source and drain diffusion regions 137 are formed on the surface of the semiconductor substrate 101. Moreover, the two P-type extension diffusion regions 135 are formed on opposite sides of the gate electrode 104F. The two P-type source and drain diffusion regions 137 are formed one on either side of the sidewalls 109F sandwiching the gate electrode 104F.

In a method of manufacturing the solid-state imaging device described above, the element isolation regions 102 are formed on the surface of the semiconductor substrate 101. The N-type buried diffusion region 108 in the photodiode 125 is formed in the pixel unit 150 by ion implantation.

A gate oxide film is formed in the pixel unit 150 and the peripheral circuit unit 160. A film of a gate electrode material is formed in the pixel unit 150 and the peripheral circuit unit 160. By patterning the gate oxide film, the gate insulating film, and the film of a gate electrode material into desired shapes, the gate insulating films 103A, 103B, 103C, and 103D and the gate electrodes 104A, 104B, 104C, and 104D are formed in the pixel unit 150, and the gate insulating films 133E and 133F and the gate electrodes 104E and 104F are formed in the peripheral circuit unit 160.

The N-type extension diffusion regions 134 are selectively formed by the ion implantation on the surface of the semiconductor substrate 101 in the peripheral circuit unit 160.

The N-type LDD diffusion regions 106A, 106B, 106C, and 106D are selectively formed by the ion implantation on the surface of the semiconductor substrate 101 in the pixel unit 150.

The P-type extension diffusion regions 135 are selectively formed by the ion implantation on the surface of the semiconductor substrate 101 in the peripheral circuit unit 160.

The sidewalls 109A to 109F are formed on the side faces of the gate electrodes 104A to 104F, respectively.

The N-type source and drain diffusion regions 136 are selectively formed by the ion implantation on the surface of the semiconductor substrate 101 in the peripheral circuit unit 160.

The N-type source and drain diffusion regions 107A, 107B, 107C, and 107D are selectively formed by the ion implantation on the surface of the semiconductor substrate 101 in the pixel unit 150.

The P-type source and drain diffusion regions 137 are selectively formed by the ion implantation on the surface of the semiconductor substrate 101 in the peripheral circuit unit 160.

To activate impurities in the diffusion regions, a heat treatment is performed at a temperature range of 800° C. to 1000° C. using a lamp annealing apparatus. Here, the use of the lamp annealing apparatus allows the heat treatment in a short period of time to activate the impurities. This can suppress thermal diffusion of the diffusion regions. That is, the gate lengths of the NchMOS transistor 126 and the PchMOS transistor 127 can be decreased by suppressing the thermal diffusion of the N-type extension diffusion regions 134 and P-type extension diffusion regions 135 in the peripheral circuit unit 160. This allows the transistors included in the peripheral circuit unit 160 to be miniaturized.

However, in the solid-state imaging device illustrated in FIGS. 21 and 22, the impurity concentrations of the N-type source and drain diffusion regions 107A, 107B, 107C, and 107D in the pixel unit 150 need to be high (e.g., a concentration of at least $10^{20}$ cm$^{-3}$). Thus, defects are caused on the surface of the semiconductor substrate 101 due to damage caused by the ion implantation.

Moreover, if the heat treatment is performed using the lamp annealing apparatus to activate these diffusion regions, the defects on the surface of the semiconductor substrate 101 cannot be fully repaired. This means that, in particular, defects in the N-type source and drain diffusion regions 107C and the N-type source and drain diffusion region 107D, which function as floating diffusions, become leak current sources, thereby deteriorating pixel characteristics.

Moreover, for instance, the following introduces the case where a technology disclosed in PTL 1 is applied to the stacked image sensor disclosed in PTL 2. In this case, an impurity diffusion region having a high impurity concentration is formed by the ion implantation in an N-type source and drain diffusion region in a pixel unit. Subsequently, to prevent damage due to the ion implantation, a high-temperature sintering treatment (for example, at a temperature of 400° C. or above) is performed after a photoelectric conversion film is formed. In this case, degradation of the photoelectric conversion characteristics of a layered film is a problem.

Solution to Problem

A solid-state imaging device according to an aspect of the present disclosure includes: a semiconductor substrate; a pixel unit formed on the semiconductor substrate; and a peripheral circuit unit formed on the semiconductor substrate, at a periphery of the pixel unit, in which the pixel unit includes: a photoelectric conversion film which converts incident light into charges; and a floating diffusion which holds the charges, the peripheral circuit unit includes a transistor including a gate electrode and two source and drain diffusion regions, and the two source and drain diffusion regions have a higher impurity concentration than an impurity concentration of the floating diffusion.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Figure 1:
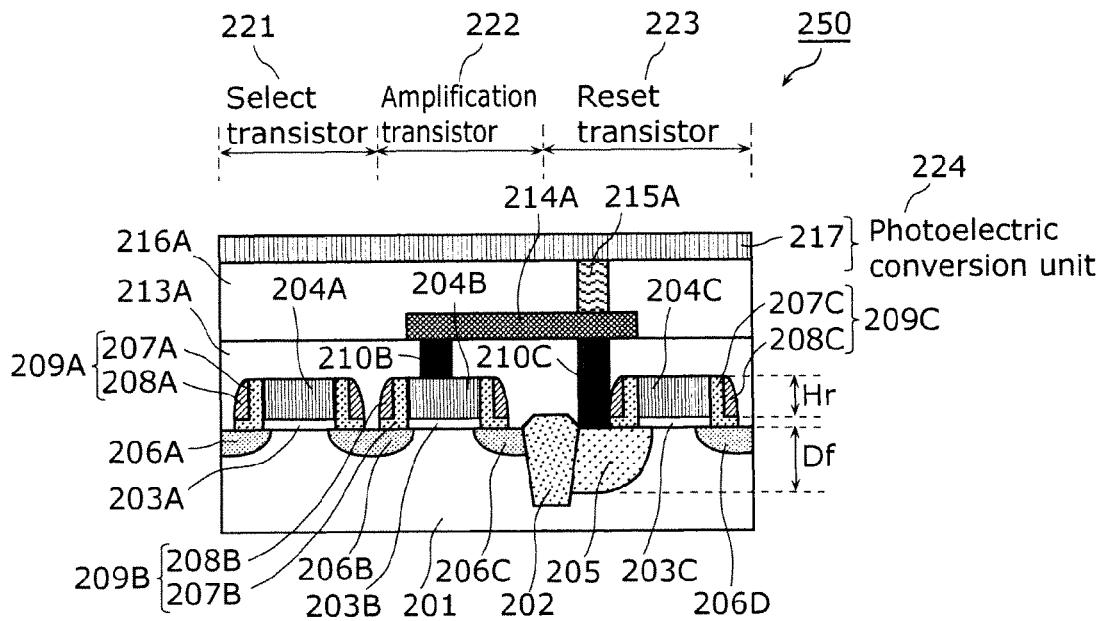
FIG. 1 is a cross-sectional view of a pixel unit of a solid-state imaging device according to the embodiment.

A solid-state imaging device according to an aspect of the present disclosure includes: a semiconductor substrate; a pixel unit formed on the semiconductor substrate; and a peripheral circuit unit formed on the semiconductor substrate, at a periphery of the pixel unit, in which the pixel unit includes: a photoelectric conversion film which converts incident light into charges; and a floating diffusion which holds the charges, the peripheral circuit unit includes a transistor including a gate electrode and two source and drain diffusion regions, and the two source and drain diffusion regions have a higher impurity concentration than an impurity concentration of the floating diffusion.

This configuration allows the solid-state imaging device according to an aspect of the present disclosure to suppress the expansion of the source and drain diffusion regions in the transistor of the peripheral circuit unit. This can decrease the gate length of the transistor of the peripheral circuit unit. Moreover, the solid-state imaging device can repair defects on the surface of the semiconductor substrate due to damage caused by ion implantation to form a floating diffusion in the pixel unit. Thus, in the solid-state imaging device, it is possible to achieve both of the miniaturization of the transistor included in the peripheral circuit unit and the reduction of defects due to damage caused by the ion implantation to form the floating diffusion in the pixel unit.

Moreover, depths of the two source and drain diffusion regions may be at most a height of the gate electrode.

This configuration means that the expansion of the source and drain diffusion regions is suppressed. Thus, the gate length of the transistor of the peripheral circuit unit can be decreased.

Moreover, a depth of the floating diffusion may be at least a height of the gate electrode.

The configuration means that the floating diffusion is sufficiently diffused. Thus, gradual expansion of the floating diffusion can suppress a leakage current in PN junction. This can improve the sensitivity of a pixel.

Moreover, the two source and drain diffusion regions may have an impurity concentration of at least $1 \times 10^{20}$ cm$^{-3}$.

According to this configuration, the source and drain diffusion regions have low resistance. Thus, the driving capability of the transistor can be improved.

Moreover, the floating diffusion may have an impurity concentration of at most $1 \times 10^{19}$ cm$^{-3}$.

This configuration can gradually expand the floating diffusion.

Moreover, the gate electrode may have a length of 65 nm or less.

This configuration can improve the driving capability of the transistor included in the peripheral circuit unit.

Moreover, the solid-state imaging device may further include: a non-metal contact plug connected with the floating diffusion; and a line connected with the non-metal contact plug, in which the floating diffusion and the photoelectric conversion film are connected via the non-metal contact plug and the line.

This configuration can achieve a lower contact resistance between the floating diffusion and the contact plug than the case where a contact plug of general metal such as tungsten is used.

Moreover, the photoelectric conversion film may be formed with an organic material.

A method of manufacturing a solid-state imaging device according to an aspect of the present disclosure is a method of manufacturing a solid-state imaging device which includes: a semiconductor substrate; a pixel unit formed on the semiconductor substrate; and a peripheral circuit unit formed on the semiconductor substrate, at a periphery of the pixel unit, in which the pixel unit includes: a photoelectric conversion film which converts incident light into charges; and a floating diffusion which holds the charges, and the peripheral circuit unit includes a transistor including a gate electrode and two source and drain diffusion regions. The method includes: (a) forming the gate electrode above the semiconductor substrate; (b) implanting a first impurity into the semiconductor substrate after step (a) to form the floating diffusion; (c) performing a first heat treatment after step (b); and (d) forming the two source and drain diffusion regions after step (c).

Moreover, step (d) may include: (e) implanting a second impurity into the semiconductor substrate to form diffusion regions of a low impurity concentration to be included in the two source and drain diffusion regions; (f) forming sidewalls on side faces of the gate electrode after step (e); (g) implanting a third impurity into the semiconductor substrate after step (f) to form diffusion regions of a high impurity concentration to be included in the two source and drain diffusion regions; and (h) performing a second heat treatment after step (g).

According to this, defects due to damage caused by the ion implantation can be reduced by performing the first heat treatment on the floating diffusion in the method of manufacturing of a solid-state imaging device according to an aspect of the present disclosure. Moreover, the method of manufacturing can suppress the expansion of the source and drain diffusion regions in the peripheral circuit unit by properly setting conditions for the second heat treatment. This can decrease the gate length of the transistor. Thus, the method of manufacturing can achieve both of miniaturization of the transistor included in the peripheral circuit unit and reduction of defects due to damage caused by the ion implantation to form the floating diffusion in the pixel unit.

Moreover, the first heat treatment may be performed at a temperature of 800° C. or above using a diffusion furnace.

This can repair defects on the surface of the semiconductor substrate in the pixel unit due to damage caused by the ion implantation in step (b).

Moreover, the second heat treatment may be performed at a temperature of 900° C. or above using a lamp annealing apparatus.

This can achieve both of activation and suppression of thermal diffusion of the second impurity and the third impurity implanted into the surface of the semiconductor substrate in the peripheral circuit unit. Thus, the gate length of the transistor of the peripheral circuit unit can be decreased.

Moreover, the method of manufacturing a solid-state imaging device may further include forming a non-metal contact plug to be connected with the floating diffusion, after step (h).

This can achieve a lower contact resistance between the floating diffusion and the contact plug than the case where a contact plug of general metal such as tungsten is used.

Moreover, the non-metal contact plug may be polycrystal silicon containing an impurity of a same conductivity type as the first impurity.

Moreover, the method of manufacturing a solid-state imaging device may further include performing a third heat treatment using a diffusion furnace after step (h), in which the third heat treatment is performed at a temperature which is at most a temperature during the first heat treatment.

This can decrease dangling bonds caused on an interface between a gate insulating film and the semiconductor substrate in the pixel unit when the lamp annealing apparatus is used in the second heat treatment. Moreover, a temperature during the third heat treatment is at most a temperature during the first heat treatment. Thus, it is possible to suppress thermal diffusion of the second impurity implanted into the surface of the semiconductor substrate in the peripheral circuit unit. This can decrease the gate length of the transistor of the peripheral circuit unit.

Moreover, the present disclosure can be achieved as a semiconductor integrated circuit (LSI) which achieves part or all of the functions of such a solid-state imaging device or as an imaging apparatus (a camera) including the solid-state imaging device.

The following describes a solid-state imaging device and a method of manufacturing the solid-state imaging device according to the present embodiment with reference to the drawings.

The exemplary embodiment described below shows a general or specific example. The numerical values, shapes, materials, structural elements, the arrangement and connection of the structural elements, steps, the processing order of the steps, and others shown in the following embodiment are mere examples, and therefore do not limit the present invention. Moreover, among the structural elements in the following embodiment, the structural elements not recited in the independent claims representing superordinate concept are described as optional structural elements.

The following describes a configuration of the solid-state imaging device according to the present embodiment.

Figure 2:
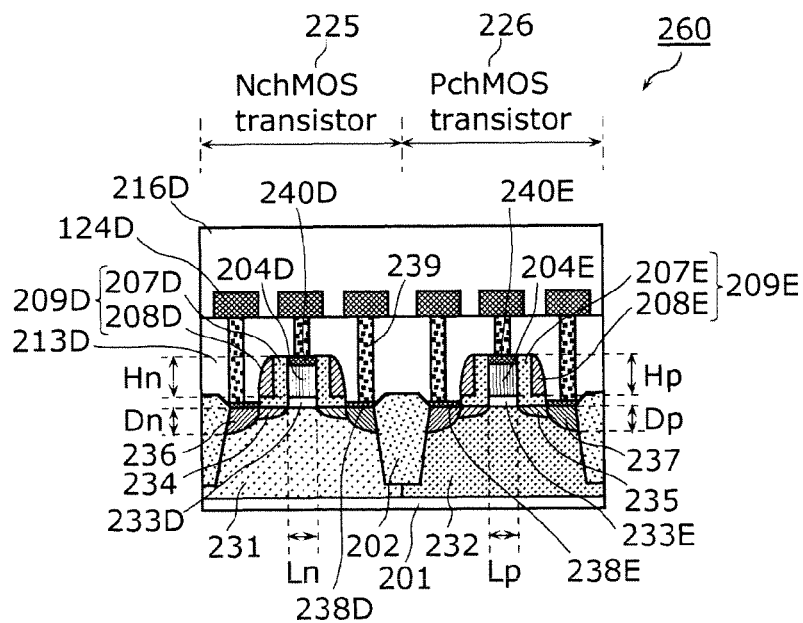
FIG. 2 is a cross-sectional view of a peripheral circuit unit of the solid-state imaging device according to the embodiment.

The solid-state imaging device according to the present embodiment includes a pixel unit 250 and a peripheral circuit unit 260 formed at the periphery of the pixel unit 250. FIG. 1 is a cross-sectional view of the pixel unit 250 of the solid-state imaging device according to the present embodiment. Moreover, FIG. 2 is a cross-sectional view of the peripheral circuit unit 260 of the solid-state imaging device according to the present embodiment.

The pixel unit 250 illustrated in FIG. 1 includes a select transistor 221, an amplification transistor 222, a reset transistor 223, and a photoelectric conversion unit 224.

Moreover, the amplification transistor 222 and the reset transistor 223 are isolated by an element isolation region 202 (a shallow trench isolation (STI) region). It should be noted that an implant isolation region may be used as the element isolation region 202 instead of the STI region.

The use of the implant isolation region can decrease a leakage current due to crystal defects on the interface between the element isolation region 202 and a semiconductor substrate 201.

The select transistor 221 includes a gate insulating film 203A, a gate electrode 204A, sidewalls 209A, an N-type diffusion region 206A, and an N-type diffusion region 206B. Here, the gate insulating film 203A is formed on the semiconductor substrate 201. The gate electrode 204A is formed on the gate insulating film 203A. The sidewalls 209A are formed on the side faces of the gate electrode 204A. The N-type diffusion region 206A is formed on one side of the gate electrode 204A. The N-type diffusion region 206B is formed on the opposite side of the gate electrode 204A. The sidewall 209A includes a silicon oxide film 207A and a silicon nitride film 208A. Moreover, the N-type diffusion region 206A and the N-type diffusion region 206B are formed on the surface of the semiconductor substrate 201.

The amplification transistor 222 includes a gate insulating film 203B, a gate electrode 204B, sidewalls 209B, the N-type diffusion region 206B, and an N-type diffusion region 206C. Here, the gate insulting film 203B is formed on the semiconductor substrate 201. The gate electrode 204B is formed on the gate insulating film 203B. The sidewalls 209B are formed on the side faces of the gate electrode 204B. The N-type diffusion region 206B is formed on one side of the gate electrode 204B. The N-type diffusion region 206C is formed on the opposite side of the gate electrode 204B. The sidewall 209B includes a silicon oxide film 207B and a silicon nitride film 208B. Moreover, the N-type diffusion region 206B and the N-type diffusion region 206C are formed on the surface of the semiconductor substrate 201.

The reset transistor 223 includes a gate insulating film 203C, a gate electrode 204C, sidewalls 209C, an N-type diffusion region 205, and an N-type diffusion region 206D. Here, the gate insulating film 203C is formed on the semiconductor substrate 201. The gate electrode 204C is formed on the gate insulating film 203C. The sidewalls 209C are formed on the side faces of the gate electrode 204C. The N-type diffusion region 205 is formed on one side of the gate electrode 204C. The N-type diffusion region 206D is formed on the opposite side of the gate electrode 204C. The sidewall 209C includes a silicon oxide film 207C and a silicon nitride film 208C. Moreover, the N-type diffusion region 205 and the N-type diffusion region 206D are formed on the surface of the semiconductor substrate 201.

The photoelectric conversion unit 224 includes a photoelectric conversion film 217. The photoelectric conversion film 217 converts incident light into an electric signal (charges).

The gate electrode 204B included in the amplification transistor 222 is connected to a non-metal contact plug 210B. The N-type diffusion region 205 is connected to a non-metal contact plug 210C. The non-metal contact plugs 210B and 210C are connected to a metal line 214A. That is, the gate electrode 204B in the amplification transistor 222 and the N-type diffusion region 205 are electrically connected via the non-metal contact plugs 210B and 210C and the metal line 214A. Moreover, the metal line 214A is connected to the photoelectric conversion film 217 via a metal plug 215A.

The N-type diffusion region 205 functions as a floating diffusion which holds charges generated in the photoelectric conversion film 217.

Here, the relationship Hr<Df holds, where Hr represents the height of the gate electrode 204C and Df represents the junction depth of the N-type diffusion region 205. That is, the junction depth Df of the N-type diffusion region 205 is greater than the height Hr of the gate electrode 204C. Here, in the present embodiment, thermal diffusion is performed to suppress a leakage current in PN junction between the N-type diffusion region 205 and the semiconductor substrate 201. By so doing, the N-type diffusion region 205 is sufficiently expanded toward the surface of the semiconductor substrate 201, and the junction depth becomes deeper as described above. Moreover, to suppress the leakage current in the PN junction, preferably, the impurity concentration of the N-type diffusion region 205 should be at most $1 \times 10^{19}$ $cm^{-3}$.

Moreover, the non-metal contact plugs 210B and 210C are, for example, polycrystal silicon containing impurities of the same conductivity type as the impurities of the N-type diffusion region 205.

Moreover, the peripheral circuit unit 260 illustrated in FIG. 2 includes an NchMOS transistor 225 and a PchMOS transistor 226. Moreover, the NchMOS transistor 225 and the PchMOS transistor 226 formed on the surface of the semiconductor substrate 201 are separated by the element isolation region 202.

The NchMOS transistor 225 includes a P-well 231, a gate insulting film 233D, a gate electrode 204D, sidewalls 209D, N-type extension diffusion regions 234, N-type source and drain diffusion regions 236, and silicide films 238D and 240D. Here, the P-well 231 is formed on the surface of the semiconductor substrate 201. The gate insulating film 233D is formed above the semiconductor substrate 201. The gate electrode 204D is formed on the gate insulating film 233D. The sidewalls 209D are formed on the side faces of the gate electrode 204D. The N-type extension diffusion regions 234 are formed on the surface of the semiconductor substrate 201, on opposite sides of the gate electrode 204D. The N-type source and drain diffusion regions 236 are formed on the semiconductor substrate 201, one on either side of the sidewalls 209D sandwiching the gate electrode 204D. The silicide films 238D and the silicide film 240D are respectively formed on the surfaces of the N-type source and drain diffusion regions 236 and the gate electrode 204D. The sidewall 209D includes a silicon oxide film 207D and a silicon nitride film 208D.

The PchMOS transistor 226 includes an N-well 232, a gate insulating film 233E, a gate electrode 204E, sidewalls 209E, P-type extension diffusion regions 235, P-type source and drain diffusion regions 237, silicide films 238E and 240E. Here, the N-well 232 is formed on the semiconductor substrate 201. The gate insulating film 233E is formed above the semiconductor substrate 201. The gate electrode 204E is formed on the gate insulating film 233E. The sidewalls 209E are formed on the side faces of the gate electrode 204E. The P-type extension diffusion regions 235 are formed on the semiconductor substrate 201, on the opposite sides of the gate electrode 204E. The P-type source and drain diffusion regions 237 are formed on the semiconductor substrate 201, one on either side of the sidewalls 209E sandwiching the gate electrode 204E. The silicide films 238E and the silicide film 240E are respectively formed on the surfaces of the P-type source and drain diffusion regions 237 and the gate electrode 204E. The sidewall 209E includes a silicon oxide film 207E and a silicon nitride film 208E.

The silicide films 238D, 238E, 240D, and 240E are connected with metal contact plugs 239. The metal contact plugs 239 are connected with metal lines 214D, respectively.

Here, to reduce parasitic resistance in the sources and drains of the NchMOS transistor 225 and the PchMOS transistor 226 and improve the driving capabilities of the transistors, it is preferable that the impurity concentration of each of the N-type source and drain diffusion regions 236 and the P-type source and drain diffusion regions 237 be at least $1 \times 10^{20}$ cm$^{-3}$.

Moreover, the relationships Hn≧Dn and Hp≧Dp hold, where Hn represents the height of the gate electrode 204D, Hp represents the height of the gate electrode 204E, Dn represents the junction depth of the N-type source and drain diffusion region 236, and Dp represents the junction depth of the P-type source and drain diffusion region 237. That is, the junction depth Dn of the N-type source and drain diffusion region 236 is at most the height Hn of the gate electrode 204D. The junction depth Dp of the P-type source and drain diffusion region 237 is at most the height Hp of the gate electrode 204E. Moreover, in the present embodiment, the expansion of the N-type source and drain diffusion regions 236 and the P-type source and drain diffusion regions 237 due to the thermal diffusion of these layers is suppressed to improve the driving capabilities of the NchMOS transistor 225 and the PchMOS transistor 226. This can decease a gate length Ln of the NchMOS transistor 225 and a gate length Lp of the PchMOS transistor 226. For instance, the driving capabilities of the MOS transistors can be improved by setting the gate lengths Ln and Lp to 65 nm or less.

As described above with reference to the drawings, the solid-state imaging device according to the present embodiment includes the pixel unit 250 and the peripheral circuit unit 260 formed at the periphery of the pixel unit 250, both of which are formed on the semiconductor substrate 201. The pixel unit 250 includes the photoelectric conversion film 217 which converts incident light into charges and a floating diffusion (the N-type diffusion region 205) which holds the charges generated by the photoelectric conversion film 217. The peripheral circuit unit 260 includes the NchMOS transistor 225 including the gate electrode 204D and the two N-type source and drain diffusion regions 236 and the PchMOS transistor 226 including the gate electrode 204E and the two P-type source and drain diffusion regions 237. The impurity concentration of each of the two N-type source and drain diffusion regions 236 and the two P-type source and drain diffusion regions 237 is higher than the impurity concentration of the N-type diffusion region 205 (floating diffusion).

This can suppress the expansion of the N-type source and drain diffusion regions 236 and the P-type source and drain diffusion regions 237. Thus, the gate lengths of the NchMOS transistor 225 and the PchMOS transistor 226 can be decreased. Furthermore, it is possible to repair defects on the surface of the semiconductor substrate 201 due to damage caused by ion implantation to form the floating diffusion in the pixel unit 250, thereby achieving the pixel characteristic of high sensitivity. That is, defects such as dangling bond can be reduced without performing, after forming the photoelectric conversion film 217, the high temperature sintering treatment which results in characteristic degradation of the photoelectric conversion film 217 (the treatment is performed at, for example, a temperature of 400° C. or above). It should be noted that if the photoelectric conversion film 217 is formed with an organic material, the heat resistance of the film often becomes a problem. Thus, if the photoelectric conversion film 217 is formed with the organic material, advantageous effects of the present embodiment will become more obvious than the case where the photoelectric conversion film 217 is formed with an inorganic material. Another problem is degradation of the characteristics of the solid-state imaging device due to light reflection off the photoelectric conversion film 217. The characteristic degradation can be mitigated by forming the photoelectric conversion film 217 with an organic material.

Moreover, the depths of the N-type source and drain diffusion region 236 and the P-type source and drain diffusion region 237 may be at most the heights of the gate electrodes 204D and 204E, respectively. This means that the expansion of the N-type source and drain diffusion regions 236 and the P-type source and drain diffusion regions 237 is suppressed. Thus, the gate lengths of the NchMOS transistor 225 and the PchMOS transistor 226 in the peripheral circuit unit 260 can be decreased.

Moreover, the depth of the floating diffusion (the N-type diffusion region 205) may be at least the heights of the gate electrodes 204A to 204C. This means that the floating diffusion is sufficiently diffused. Thus, gradual expansion of the floating diffusion can suppress a leakage current in the PN junction. This can improve the sensitivity of a pixel.

Moreover, the impurity concentration of each of the N-type source and drain diffusion regions 236 in the NchMOS transistor 225 and the P-type source and drain diffusion regions 237 in the PchMOS transistor 226 may be at least $1 \times 10^{20}$ cm$^{-3}$. By so doing, the N-type source and drain diffusion regions 236 and the P-type source and drain diffusion regions 237 have low resistance. Thus, the driving capabilities of the NchMOS transistor 225 and the PchMOS transistor 226 can be improved.

Moreover, the impurity concentration of the floating diffusion (the N-type diffusion region 205) may be at most $1 \times 10^{19}$ cm$^{-3}$. This can gradually expand the floating diffusion.

Moreover, the lengths of the gate electrodes 204D and 204E respectively in the NchMOS transistor 225 and the PchMOS transistor 226 may be 65 nm or less. This can improve the driving capabilities of the NchMOS transistor 225 and the PchMOS transistor 226 in the peripheral circuit unit 260.

Moreover, the floating diffusion (the N-type diffusion region 205) may be connected with the photoelectric conversion film 217 via the non-metal contact plug 210C and the metal line 214A by connecting the non-metal contact plug 210C to the floating diffusion. This can achieve lower contact resistance between the floating diffusion and the contact plug than the case where a contact plug of general metal such as tungsten is used.

It should be noted that the solid-state imaging device according to the present embodiment is not limited to the above configuration, and the present disclosure is applicable to solid-state imaging devices having other configurations. For instance, in the above example, the present disclosure is applied to the solid-state imaging device in which a photoelectric conversion film is used as a photoelectric conversion unit. However, the present disclosure may be applied to a solid-state imaging device which includes a photodiode having a buried diffusion region formed in a semiconductor substrate.

Moreover, in the above description, the transistors included in the pixel unit 250 are Nch transistors. However, a part or all of the transistors may be Pch transistors.

Moreover, in the above description, the peripheral circuit unit 260 includes the NchMOS transistor 225 and the PchMOS transistor 226. However, the peripheral circuit unit 260 may include either the NchMOS transistor 225 or the PchMOS transistor 226.

Moreover, an implant isolation region may be used as the element isolation region 202, instead of a STI region. By so doing, it is possible to decrease a leakage current due to crystal defects on the interface between the STI region and the semiconductor substrate.

Moreover, the metal line layer in the above example is a single layer. However, the metal line layer may have a multi-layer interconnect structure.

With reference to FIGS. 3 to 20, the following describes a method of manufacturing the solid-state imaging device according to the present embodiment. FIGS. 3, 5, 7, 9, 11, 13, 15, 17, and 19 are cross-sectional views of the pixel unit 250 in a manufacturing process of the solid-state imaging device according to the present embodiment. Moreover, FIGS. 4, 6, 8, 10, 12, 14, 16, 18, and 20 are cross-sectional views of the peripheral circuit unit 260 in the manufacturing process of the solid-state imaging device according the present embodiment.

Figure 3:
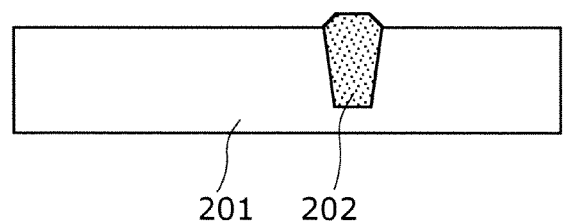
FIG. 3 is a cross-sectional view of the pixel unit in a manufacturing process of the solid-state imaging device according to the embodiment.
Figure 4:
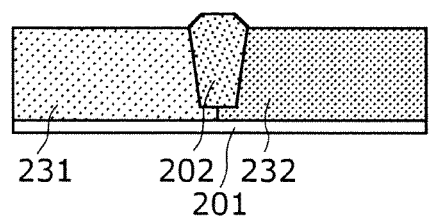
FIG. 4 is a cross-sectional view of the peripheral circuit unit in the manufacturing process of the solid-state imaging device according to the embodiment.

As FIGS. 3 and 4 illustrate, the element isolation regions 202 are formed on the surface of the semiconductor substrate 201. Here, the element isolation region 202 is formed in the pixel unit 250 so as to separate an amplification transistor region where the amplification transistor 222 is to be formed, from a reset transistor region where the reset transistor 223 is to be formed. Here, the element isolation region 202 may be formed so as to separate a select transistor region where the select transistor 221 is to be formed, from the amplification transistor region. At the same time, as FIG. 4 illustrates, the element isolation region 202 is formed so as to separate an NchMOS transistor region where the NchMOS transistor 225 is to be formed, from a PchMOS transistor region where the PchMOS transistor 226 is to be formed.

As FIG. 4 illustrates, the P-well 231 is formed by ion implantation, on the surface of the semiconductor substrate 201 in the NchMOS transistor region of the peripheral circuit unit 260. The N-well 232 is formed by the ion implantation, on the surface of the semiconductor substrate 201 in the PchMOS transistor region.

Figure 5:
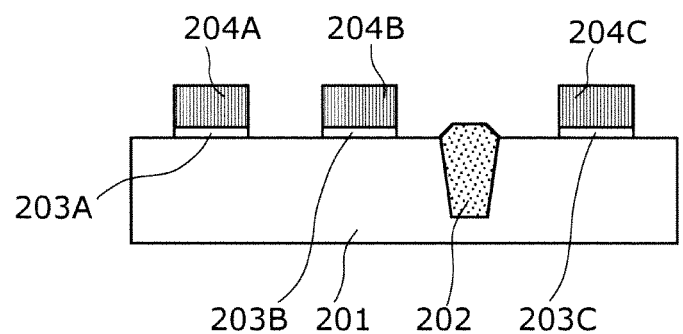
FIG. 5 is a cross-sectional view of the pixel unit in the manufacturing process of the solid-state imaging device according to the embodiment.

As FIG. 5 illustrates, a gate oxide film and a polycrystal silicon film are formed in the stated order on the surface of the semiconductor substrate 201 in the select transistor region, the amplification transistor region, and the reset transistor region of the pixel unit 250. These gate oxide film and polycrystal silicon film are patterned into desired shapes. Thus, the gate insulating film 203A and the gate electrode 204A are formed in the select transistor region. The gate insulating film 203B and the gate electrode 204B are formed in the amplification transistor region. The gate insulating film 203C and the gate electrode 204C are formed in the amplification transistor region.

Figure 6:
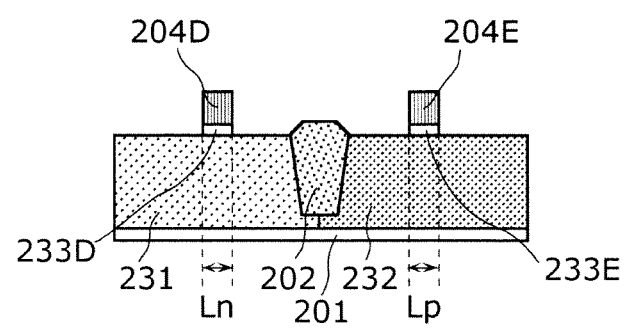
FIG. 6 is a cross-sectional view of the peripheral circuit unit in the manufacturing process of the solid-state imaging device according to the embodiment.

Moreover, as FIG. 6 illustrates, the gate insulating film and the polycrystal silicon film are formed in the stated order on the surface of the semiconductor substrate 201 in the NchMOS transistor region and the PchMOS transistor region of the peripheral circuit unit 260. These gate oxide film and polycrystal silicon film are patterned into desired shapes. Thus, the gate insulting film 233D and the gate electrode 204D are formed in the NchMOS transistor region. The gate insulating film 233E and the gate electrode 204E are formed in the PchMOS transistor region.

Here, for instance, the gate oxide films are formed in the same process in the select transistor region, the amplification transistor region, and the reset transistor region of the pixel unit 250. It should be noted that if the transistors have different film thicknesses, the gate oxide films may be formed in separate processes in the respective regions. Moreover, for instance, the gate oxide films are formed in the same process in the NchMOS transistor region and the PchMOS transistor region of the peripheral circuit unit 260.

Moreover, the polycrystal silicon films are formed in the same process in the pixel unit 250 and the peripheral circuit unit 260. Here, the polycrystal silicon films have a film thickness of 120 nm, for example. Moreover, the gate oxide films and the polycrystal silicon films are patterned into the desired shapes in the same process in the pixel unit 250 and the peripheral circuit unit 260.

Here, the length Ln of the gate electrode 204D of the NchMOS transistor 225 and the length Lp of the gate electrode 204E of the PchMOS transistor 226 in the peripheral circuit unit 260 are the gate lengths of the MOS transistors, respectively. Moreover, preferably, the minimum gate length of each of the MOS transistors should be 65 nm or less. This can improve the driving capabilities of the MOS transistors.

Figure 7:
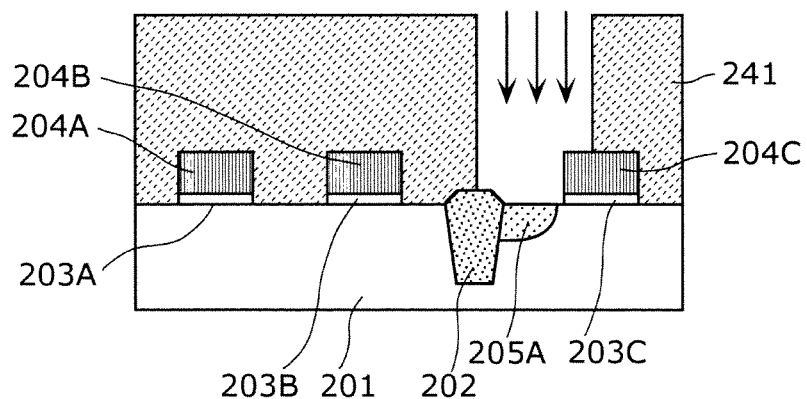
FIG. 7 is a cross-sectional view of the pixel unit in the manufacturing process of the solid-state imaging device according to the embodiment.

As FIG. 7 illustrates, a resist 241 is patterned in the pixel unit 250 so as to expose a portion of the surface of the semiconductor substrate 201 in the reset transistor region. The ion implantation selectively forms an N-type diffusion region 205A on the surface of the semiconductor substrate 201, on one side of the gate electrode 204C. A condition for the ion implantation is, for example, that ions do not pass through the gate electrode 204C to the surface of the semiconductor substrate 201 under the gate insulating film 203C.

Figure 8:
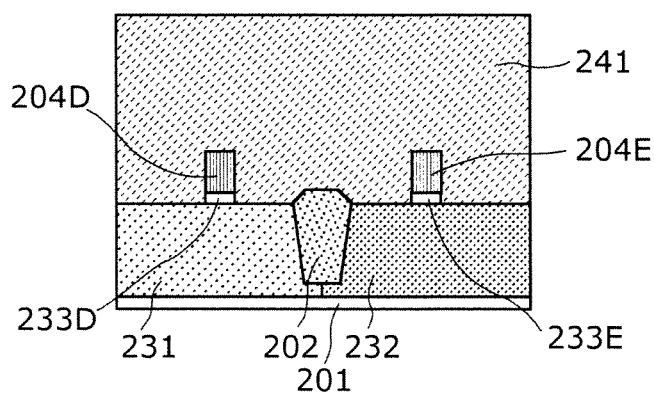
FIG. 8 is a cross-sectional view of the peripheral circuit unit in the manufacturing process of the solid-state imaging device according to the embodiment.

Moreover, preferably, a small implantation dosage of ions should be set to suppress defects due to damage caused by the ion implantation. Conditions here for the ion implantation are, for example, that phosphorus is used for a dopant (impurity), implantation energy is 30 keV, and a dosage is $1 \times 10^{11}$ to $1 \times 10^{13}$ cm$^{-2}$. Here, as FIG. 8 illustrates, the entire exposed surface of the peripheral circuit unit 260 is covered by a resist 241.

Figure 9:
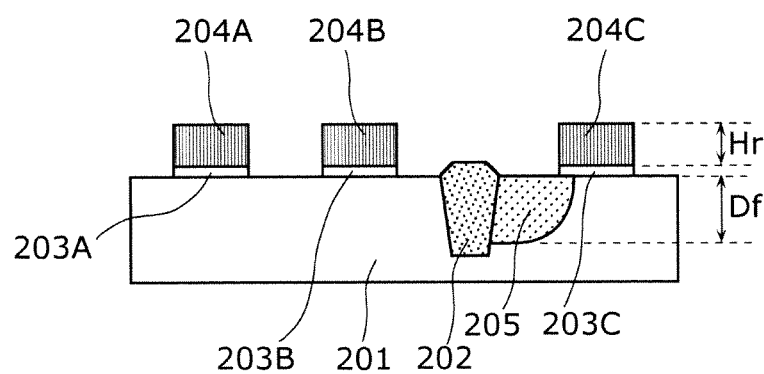
FIG. 9 is a cross-sectional view of the pixel unit in the manufacturing process of the solid-state imaging device according to the embodiment.
Figure 10:
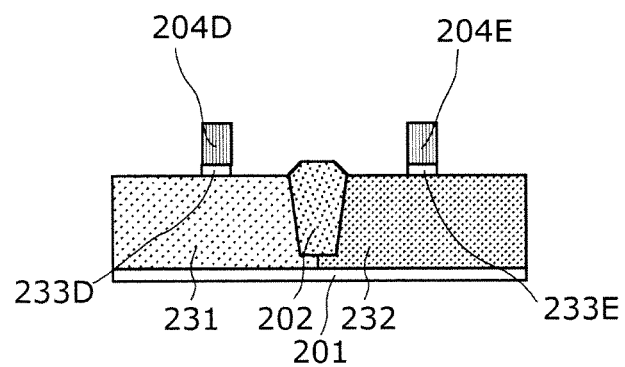
FIG. 10 is a cross-sectional view of the peripheral circuit unit in the manufacturing process of the solid-state imaging device according to the embodiment.

As FIGS. 9 and 10 illustrate, a heat treatment is performed using a diffusion furnace. Thus, the N-type diffusion region 205A is thermally diffused to form the N-type diffusion region 205. Here, the N-type diffusion region 205 is a floating diffusion which holds an electric signal generated by the photoelectric conversion unit 224 converting incident light. Moreover, this heat treatment repairs defects due to damage caused by the ion implantation to form the N-type diffusion region 205 in the pixel unit 250. Furthermore, this thermal diffusion makes a gentle impurity profile of the N-type diffusion region 205, thereby suppressing a leakage current in the PN junction between the N-type diffusion region 205 and the semiconductor substrate 201. Conditions for the heat treatment are, for example, a temperature of 800° C. to 900° C. and duration within 120 minutes.

Moreover, sufficient diffusion of the N-type diffusion region 205 by the thermal diffusion sufficiently deepens the N-type diffusion region 205. As a result, the relationship Hr<Df holds, where Hr represents the height of the gate electrode 204C and Df represents the depth of the N-type diffusion region 205 after the heat treatment.

Figure 11:
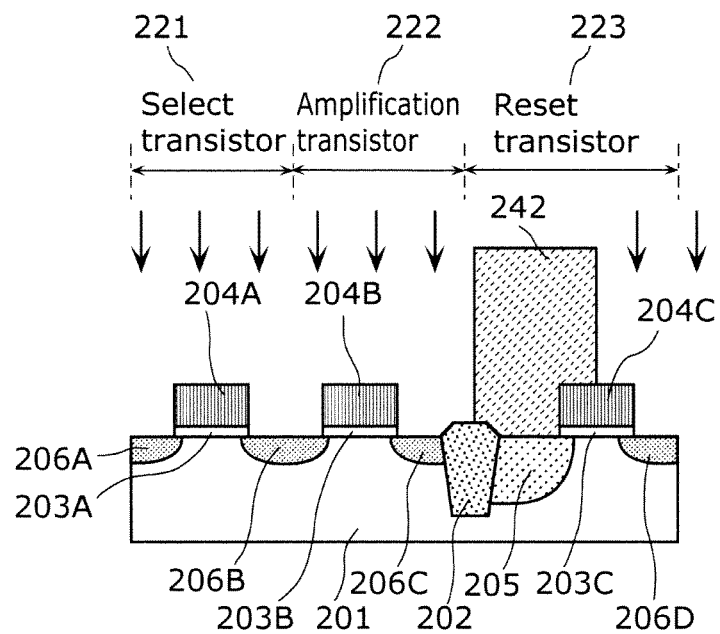
FIG. 11 is a cross-sectional view of the pixel unit in the manufacturing process of the solid-state imaging device according to the embodiment.

As FIG. 11 illustrates, a resist 242 is patterned in the pixel unit 250 so as to expose portions of the surface of the semiconductor substrate 201 other than a portion of the surface corresponding to the N-type diffusion region 205. The ion implantation selectively forms in the same process on the surface of the semiconductor substrate 201, the N-type diffusion regions 206A, 206B, 206C, and 206D. Here, the N-type diffusion regions 206A and 206B are formed on opposite sides of the gate electrode 204A in the select transistor region. The N-type diffusion regions 206B and 206C are formed on opposite sides of the gate electrode 204B in the amplification transistor region. The N-type diffusion region 206D is formed on one side of the gate electrode 204C in the reset transistor region that is the side on which the N-type diffusion region 206D faces the N-type diffusion region 205 across the gate electrode 204C.

Figure 12:
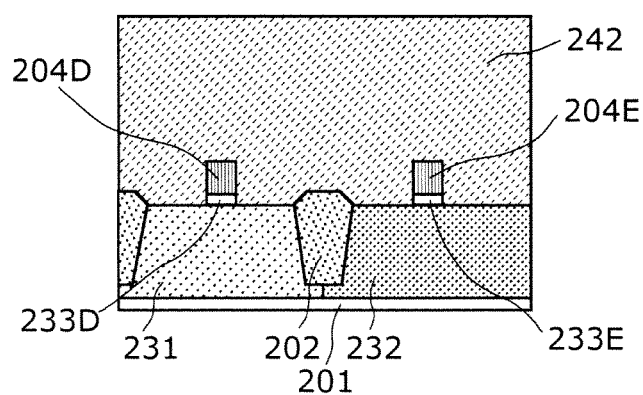
FIG. 12 is a cross-sectional view of the peripheral circuit unit in the manufacturing process of the solid-state imaging device according to the embodiment.

Conditions for the ion implantation are, for example, that phosphorus is used for a dopant, implantation energy is 20 keV, and a dosage is $1\times10^{12}$ to $1\times10^{14}$ cm$^{-2}$. Here, if it is preferable that the N-type diffusion regions 206A, 206B, and 206C be separately formed, resists having openings respectively corresponding to the N-type diffusion regions are sequentially patterned and the respective N-type diffusion regions are formed under different implantation conditions. Here, as FIG. 12 illustrates, the entire exposed surface of the peripheral circuit unit 260 is covered by the resist 242. Moreover, the ion implantation may be performed before the heat treatment in FIGS. 9 and 10.

Figure 13:
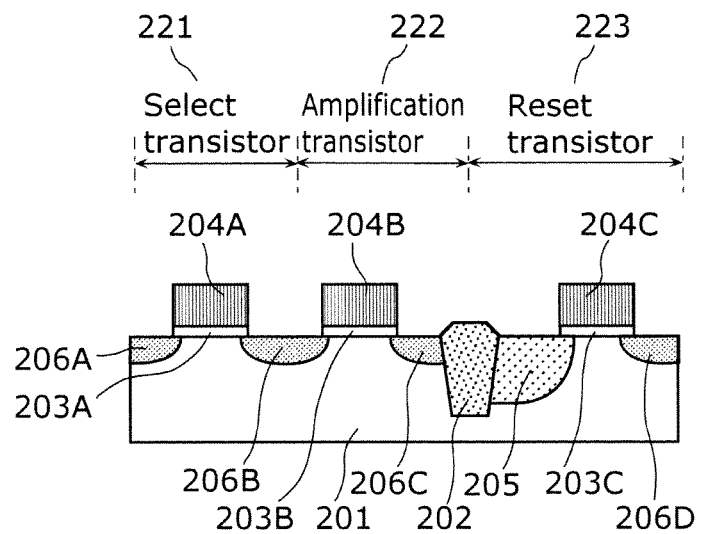
FIG. 13 is a cross-sectional view of the pixel unit in the manufacturing process of the solid-state imaging device according to the embodiment.
Figure 14:
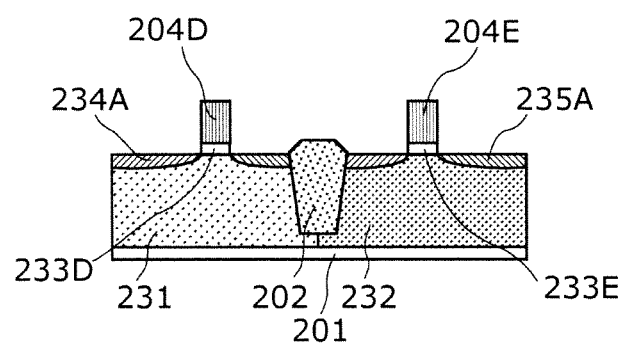
FIG. 14 is a cross-sectional view of the peripheral circuit unit in the manufacturing process of the solid-state imaging device according to the embodiment.

As FIGS. 13 and 14 illustrate, in the NchMOS transistor region in the peripheral circuit unit 260, the ion implantation forms two N-type extension diffusion regions 234A on the surface of the semiconductor substrate 201, on opposite sides of the gate electrode 204D. Subsequently, the ion implantation forms two P-type extension diffusion regions 235A on the surface of the semiconductor substrate 201, on opposite sides of the gate electrode 204E in the PchMOS transistor region. Here, conditions for the ion implantation to form the N-type extension diffusion regions 234A are, for example, that arsenic is used for a dopant, implantation energy is 5 keV, and a dosage is $1\times10^{14}$ to $1\times10^{15}$ cm$^{-2}$. Moreover, conditions for the ion implantation to form the P-type extension diffusion regions 235A are, for example, that boron is used for a dopant, implantation energy is 1 keV, and a dosage is $1\times10^{14}$ to $1\times10^{15}$ cm$^{-2}$.

Figure 15:
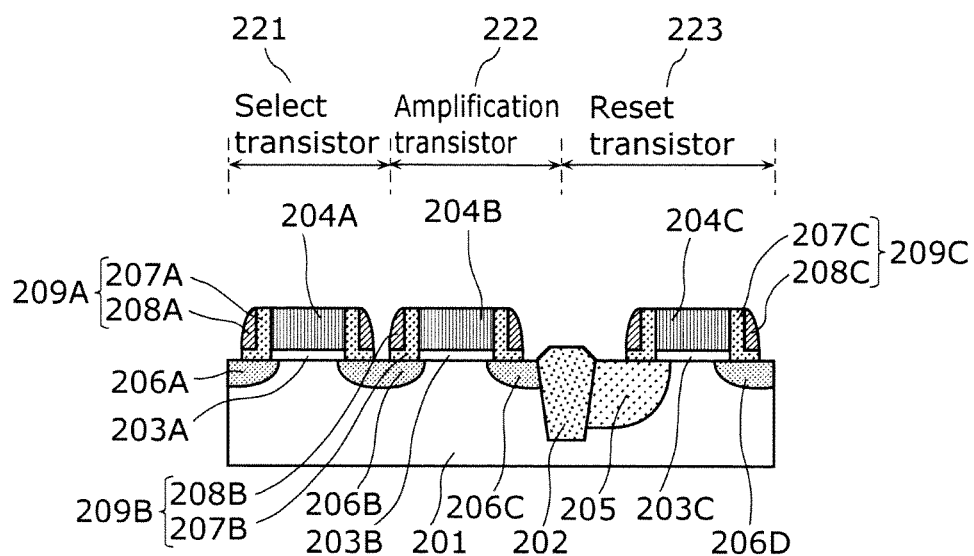
FIG. 15 is a cross-sectional view of the pixel unit in the manufacturing process of the solid-state imaging device according to the embodiment.
Figure 16:
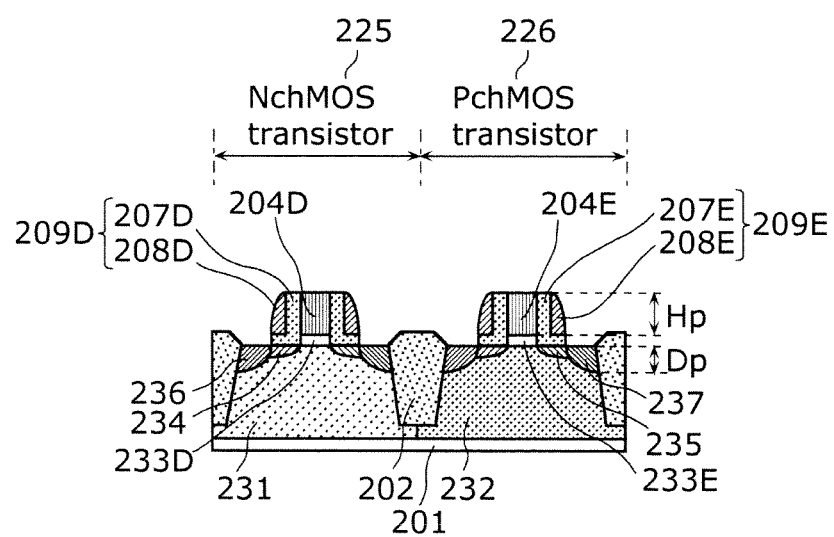
FIG. 16 is a cross-sectional view of the peripheral circuit unit in the manufacturing process of the solid-state imaging device according to the embodiment.

As FIGS. 15 and 16 illustrate, silicon oxide films and silicon nitride films are formed in the stated order on the surface of the semiconductor substrate 201. By dry-etching these silicon oxide films and silicon nitride films, the sidewalls 209A, 209B, 209C, 209D, and 209E are formed in the same process. Here, the sidewalls 209A are formed on the side faces of the gate electrode 204A in the select transistor region, and each include the silicon oxide film 207A and the silicon nitride film 208A. The sidewalls 209B are formed on the side faces of the gate electrode 204B in the amplification transistor region, and each include the silicon oxide film 207B and the silicon nitride film 208B. The sidewalls 209C are formed on the side faces of the gate electrode 204C in the reset transistor region, and each include the silicon oxide film 207C and the silicon nitride film 208C. The sidewalls 209D are formed on the side faces of the gate electrode 204D in the NchMOS transistor region, and each include the silicon oxide film 207D and the silicon nitride film 208D. The sidewalls 209E are formed on the side faces of the gate electrode 204E in the PchMOS transistor region, and each include the silicon oxide film 207E and the silicon nitride film 208E.

The N-type source and drain diffusion regions 236 are selectively formed by the ion implantation, one on either side of the sidewalls 209D sandwiching the gate electrode 204D. Moreover, the two P-type source and drain diffusion regions 237 are selectively formed by the ion implantation, one on either side of the sidewalls 209E sandwiching the gate electrode 204E. Moreover, the N-type source and drain diffusion regions 236 and the P-type source and drain diffusion regions 237 are formed on the surface of the semiconductor substrate 201.

A heat treatment is performed using a lamp annealing apparatus. This activates impurities in the N-type diffusion regions 206A, 206B, 206C, and 206D in the pixel unit 250 and impurities in the N-type and P-type extension diffusion regions 234 and 235 and the N-type and P-type source and drain diffusion regions 236 and 237 in the peripheral circuit unit 260. Here, for example, a silicon oxide film having a film thickness of 5 nm to 20 nm is formed using a chemical vapor deposition (CVD) apparatus. Moreover, a silicon nitride film having a film thickness of 30 nm to 60 nm is formed using the CVD apparatus or an atomic layer deposition (ALD) apparatus.

Here, a condition for the ion implantation to form the N-type and P-type source and drain diffusion regions 236 and 237 is, for example, that ions do not pass through the gate electrode 204D and the gate electrode 204E to the surface of the semiconductor substrate 201 under the gate insulting film 233D and the gate insulating film 233E. Conditions for the ion implantation to form the N-type source and drain diffusion regions 236 are, for example, that arsenic is used for a dopant, implantation energy is 30 keV, and a dosage is $1\times10^{15}$ to $1\times10^{16}$ cm$^{-2}$. Moreover, conditions for the ion implantation to form the P-type source and drain diffusion regions 237 are, for example, that boron is used for a dopant, implantation energy is 5 keV, and a dosage is $1\times10^{15}$ to $1\times10^{16}$ cm$^{-2}$. Moreover, conditions for the heat treatment are, for example, a temperature of 900° C. or above and duration of 5 seconds or less or spike (0 second).

These conditions for the heat treatment can concurrently (i) activate impurities in the N-type extension diffusion regions 234, the P-type extension diffusion regions 235, the N-type source and drain diffusion regions 236, and the P-type source and drain diffusion regions 237 in the peripheral circuit unit 260 and (ii) suppress the thermal diffusion of each diffusion region. Thus, the gate length of the transistors of the peripheral circuit unit 260 can be decreased, thereby improving the driving capabilities of the NchMOS transistor 225 and the PchMOS transistor 226 in the peripheral circuit unit 260.

Moreover, the treatments of a rapid temperature rise and drop are performed in the heat treatment using the lamp annealing apparatus. Thus, there is a possibility that more dangling bonds are seen on the interfaces between the semiconductor substrate 201 and the gate insulating films 203A, 203B, 203C, 233D, and 233E. The dangling bonds may degrade pixel characteristics by resulting in a leakage source especially in the amplification transistor 222. To decrease the dangling bonds, the heat treatment may be performed by the diffusion furnace after the heat treatment is performed by the lamp annealing apparatus. It should be noted that it is necessary to decrease the thermal diffusion as much as possible of the N-type extension diffusion regions 234, the P-type extension diffusion regions 235, the N-type source and drain diffusion regions 236, and the P-type source and drain diffusion regions 237 in the peripheral circuit unit 260. Thus, preferably, a temperature during the heat treatment performed in the diffusion furnace should be as low as possible. Conditions for the heat treatment are, for example, a temperature of 700° C. to 800° C. and duration within 15 minutes.

Through the above process, the impurity concentration of the N-type diffusion region 205 is at most $1\times10^{19}$ cm$^{-3}$. The impurity concentration of each of the N-type source and drain diffusion regions 236 and the P-type source and drain diffusion regions 237 is at least $1\times10^{20}$ cm$^{-3}$. That is, the impurity concentration of each of the N-type source and drain diffusion regions 236 and the P-type source and drain diffusion regions 237 is higher than the impurity concentration of the N-type diffusion region 205 (floating diffusion).

Figure 17:
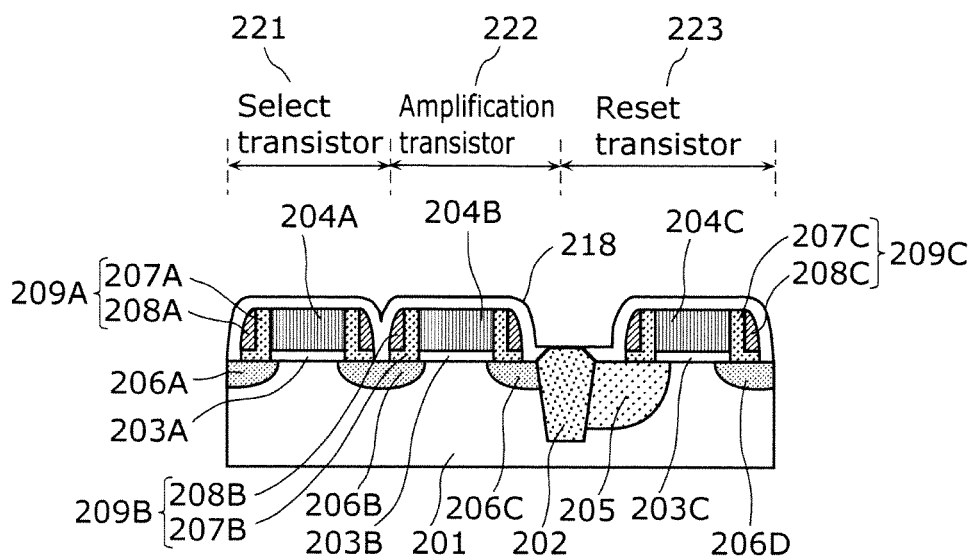
FIG. 17 is a cross-sectional view of the pixel unit in the manufacturing process of the solid-state imaging device according to the embodiment.
Figure 18:
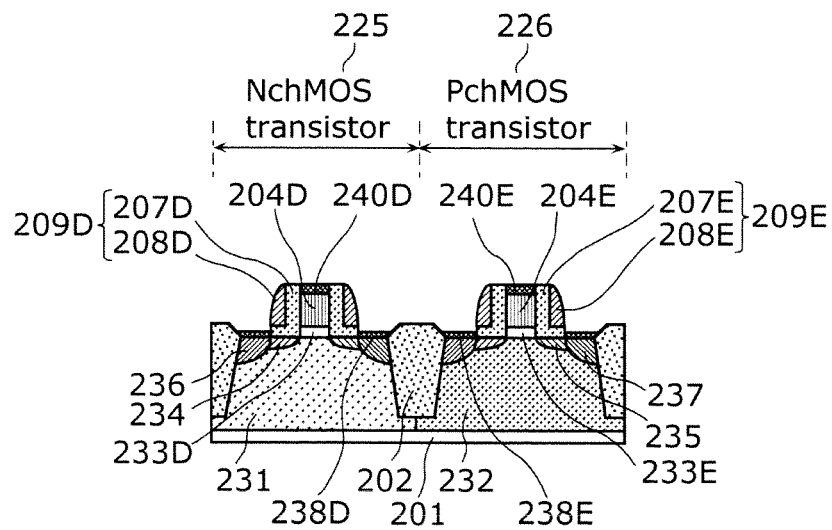
FIG. 18 is a cross-sectional view of the peripheral circuit unit in the manufacturing process of the solid-state imaging device according to the embodiment.

As FIGS. 17 and 18 illustrate, the silicide films 238D, 240D, 238E, and 240E are respectively formed on the surfaces of the N-type source and drain diffusion regions 236, the top surface of the gate electrode 204D, the surfaces of the P-type source and drain diffusion regions 237, and the top surface of the gate electrode 204E in the peripheral circuit unit 260. Here, a silicide block film 218 formed of a silicon oxide film is formed in the pixel unit 250. This can prevent silicide from being formed in the pixel unit 250. The prevention of silicide from being formed in the pixel unit 250 can prevent a metal atom from reaching the N-type diffusion region 205 as a floating diffusion and resulting in a leakage current source. This can improve pixel characteristics.

Figure 19:
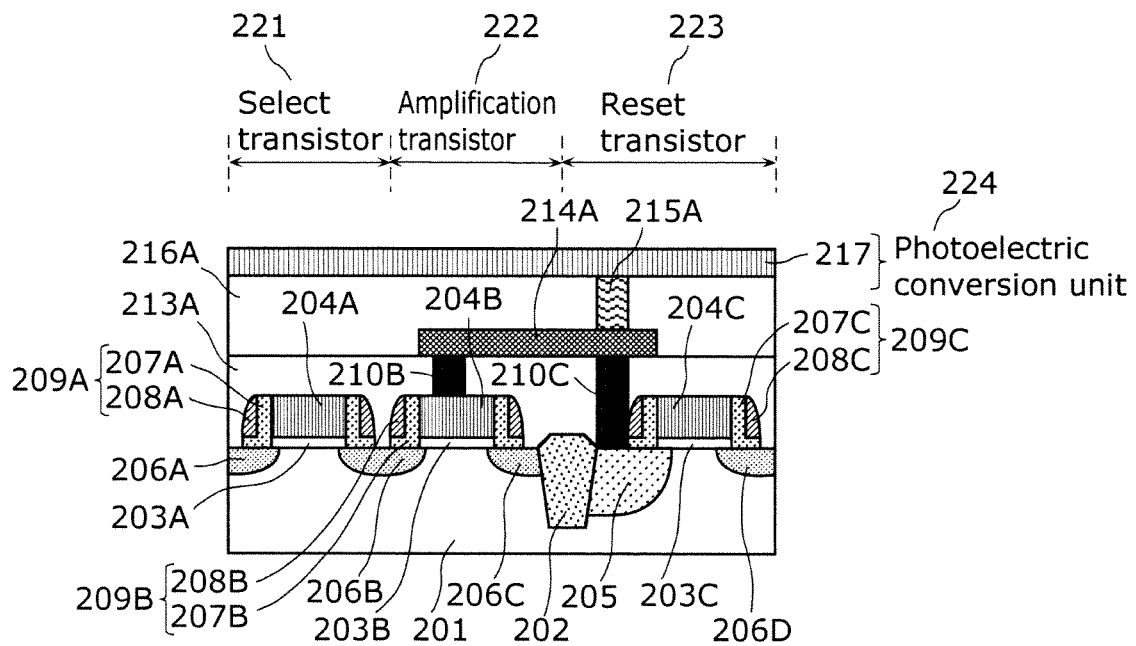
FIG. 19 is a cross-sectional view of the pixel unit in the manufacturing process of the solid-state imaging device according to the embodiment.
Figure 20:
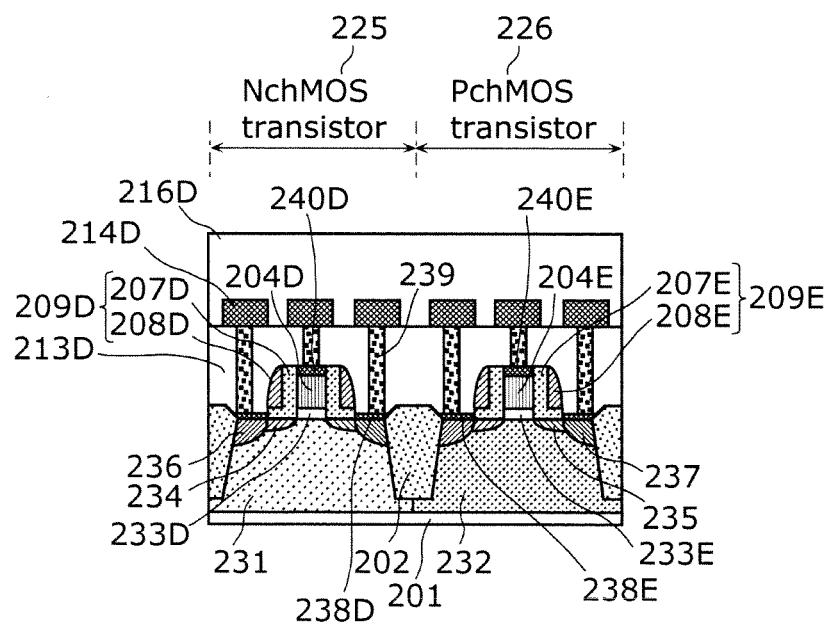
FIG. 20 is a cross-sectional view of the peripheral circuit unit in the manufacturing process of the solid-state imaging device according to the embodiment.
Figure 21:
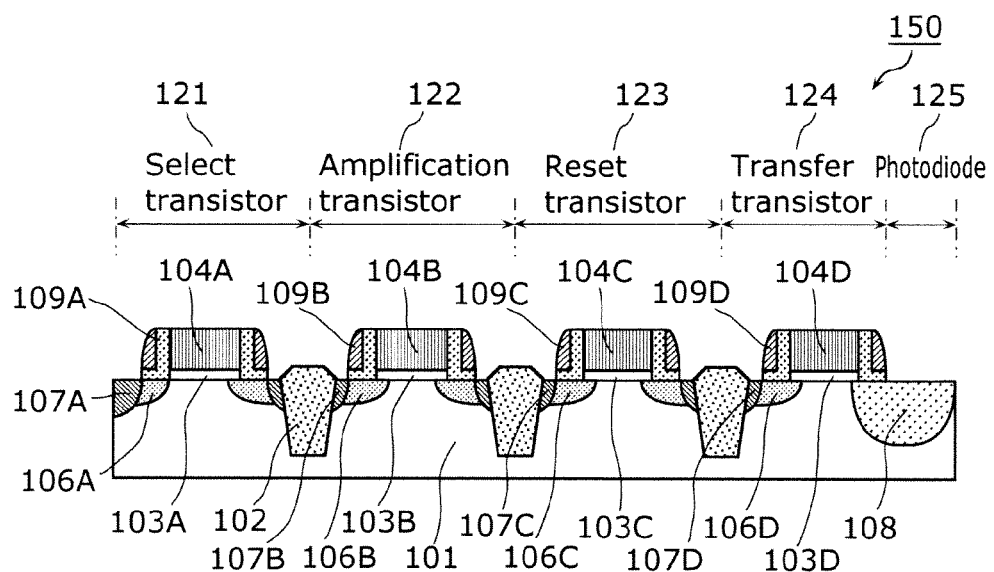
FIG. 21 is a cross-sectional view of the pixel unit of a solid-state imaging device.
Figure 22:
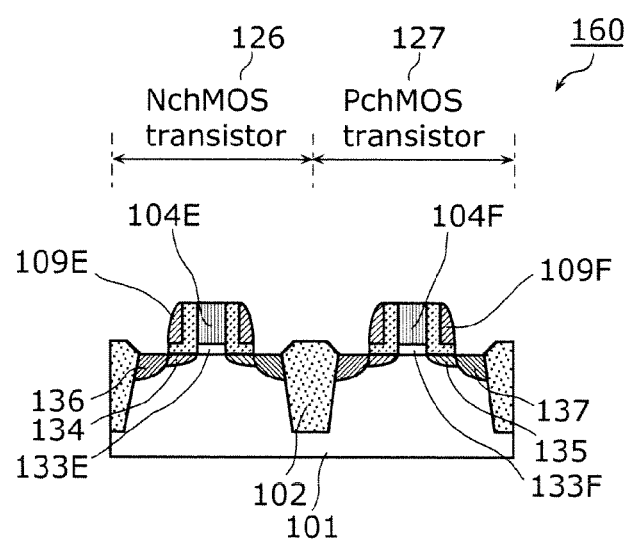
FIG. 22 is a cross-sectional view of the peripheral circuit unit of the solid-state imaging device.

As FIG. 19 illustrates, an interlayer insulating film 213A is formed in the pixel unit 250. Holes are formed so that a portion of the surface of the gate electrode 204B and a portion of the surface of the N-type diffusion region 205 are exposed. The non-metal contact plugs 210B and 210C are formed in the holes above. The metal line 214A for connecting the non-metal contact plugs 210B and 210C are formed. An interlayer insulating film 216A is formed. A hole is formed in the interlayer insulating film 216A so that a portion of the metal line 214A is exposed. The metal plug 215A is formed in the above hole. The photoelectric conversion film 217 is formed on the metal plug 215A.

Here, the photoelectric conversion film 217 is a photoelectric conversion unit which converts incident light into an electric signal. Moreover, an interlayer insulating film 213D is formed in the peripheral circuit unit 260. Holes are formed in the interlayer insulating film 213D so that a portion of each surface of the silicide films 238D, 238E, 240D, and 240E is exposed. The metal contact plugs 239 including tungsten are formed in the above holes, for example. The metal lines 214D respectively connecting with the non-metal contact plugs 239 are formed. An interlayer insulating film 216D is formed.

Here, the interlayer insulating film 213A in the pixel unit 250 and the interlayer insulating film 213D in the peripheral circuit unit 260 may be concurrently formed. Moreover, the interlayer insulating film 216A in the pixel unit 250 and the interlayer insulating film 216D in the peripheral circuit unit 260 may be concurrently formed. Moreover, the material of the non-metal contact plug 210C is, for example, polycrystal silicon containing impurities of the same conductivity type as the impurities of the N-type diffusion region 205. Here, the impurity concentration of the N-type diffusion region 205 is relatively low. Thus, the use of a metal material such as tungsten for the contact plug increases a contact resistance between the N-type diffusion region 205 and the contact plug. In contrast, the use of a non-metal contact plug can decrease a contact resistance between the N-type diffusion region 205 and the contact plug.

As described with reference to the drawings, a method of manufacturing a solid-state imaging device according to the present embodiment is a method of manufacturing a solid-state imaging device including: a pixel unit 250 formed on the semiconductor substrate 201 and a peripheral circuit unit 260 formed on the semiconductor substrate 201, at the periphery of the pixel unit 250. The pixel unit 250 includes: the photoelectric conversion film 217 which converts incident light into charges and a floating diffusion (the N-type diffusion region 205) which holds the generated charges. The peripheral circuit unit 260 includes: the NchMOS transistor 225 including the gate electrode 204D and the two N-type source and drain diffusion regions 236 and the PchMOS transistor 226 including the gate electrode 204E and the two P-type source and drain diffusion regions 237. A method of manufacturing the solid-state imaging device includes steps (a) to (g). In step (a), the gate electrodes 204A to 204E are formed above the semiconductor substrate 201 in the pixel unit 250 and the peripheral circuit unit 260. In step (b), a first impurity is implanted into the surface of the semiconductor substrate 201 in the pixel unit 250 after step (a) to form a floating diffusion (the N-type diffusion region 205). In step (c), a first heat treatment is performed after step (b). In step (d), a second impurity is implanted into the surface of the semiconductor substrate 201 in the peripheral circuit unit 260 after step (c) to form diffusion regions having a low impurity concentration (the N-type extension diffusion regions 234/the P-type extension diffusion regions 235) to be included in two source and drain diffusion regions. In step (e), the sidewalls 209D and 209E are formed on the side faces of the gate electrodes 204D and 204E after step (d). In step (f), a third impurity is implanted into the surface of the surface of the peripheral circuit unit 260 after step (e) to form diffusion regions having a high concentration (N-type source and drain diffusion regions 236/the P-type source and drain diffusion regions 237) to be included in two source and drain diffusion regions. In step (g), a second heat treatment is performed after step (f).

This allows the method of manufacturing a solid-state imaging device according to the present embodiment to reduce defects due to damage caused by ion implantation, by performing the first heat treatment on the floating diffusion. Moreover, the method of manufacturing can suppress the expansion of the N-type source and drain diffusion regions 236 and the P-type source and drain diffusion regions 237 in the peripheral circuit unit 260 by properly setting the conditions for the second heat treatment. Thus, the gate lengths of the NchMOS transistor 225 and the PchMOS transistor 226 can be decreased. Thus, the method of manufacturing can achieve both of miniaturization of the transistors included in the peripheral circuit unit 260 and reduction of defects due to damage caused by the ion implantation to form the floating diffusion in the pixel unit 250.

Moreover, the first heat treatment may be performed at a temperature of 800° C. or above using a diffusion furnace. This can repair defects on the surface of the semiconductor substrate 201 in the pixel unit 250 due to damage caused by the ion implantation in step (b).

Moreover, the second heat treatment may be performed at a temperature of 900° C. or above using a lamp annealing apparatus. This can achieve both of activation and suppression of thermal expansion of the second impurities and the third impurities implanted into the surface of the semiconductor substrate 201 of the peripheral circuit unit 260. This can decrease the gate lengths of the NchMOS transistor 225 and the PchMOS transistor 226 in the peripheral circuit unit 260.

Moreover, the method of manufacturing a solid-state imaging device according to the present embodiment may further include (h) forming the non-metal contact plug 210C in the pixel unit 250 after step (g). This can achieve a lower contact resistance between the floating diffusion and the contact plug than the case where a contact plug of general metal such as tungsten is used.

Moreover, the non-metal contact plug 210C may be polycrystal silicon containing impurities.

Moreover, the method of manufacturing a solid-state imaging device according to the present embodiment may further include performing a third heat treatment using a diffusion furnace after step (h), in which the third heat treatment may be performed at a temperature which is at most a temperature during the first heat treatment. This can decrease dangling bonds caused on the interfaces between the semiconductor substrate 201 and the gate insulating films 203A to 203C in the pixel unit 250 when a lamp annealing apparatus is used in the second heat treatment. Moreover, a temperature during the third heat treatment is at most a temperature during the first heat treatment. Thus, it is possible to suppress thermal diffusion of the second impurities implanted into the surface of the semiconductor substrate 201 in the peripheral circuit unit 260. This can decrease the gate lengths of the NchMOS transistor 225 and the PchMOS transistor 226 of the peripheral circuit unit 260.

The solid-state imaging device and the method of manufacturing the solid-state imaging device according to the present embodiment are described above. However, the present disclosure is not limited to the present embodiment.

Moreover, the process units included in the solid-state imaging device according to the present embodiment are typically achieved as large scale integration (LSI) which is an integrated circuit. These process units may become separate chips, or a part or all of the process units may form one chip.

Moreover, in the above cross-sectional views and others, the corners and the sides of the structural elements are linearly drawn. However, the present disclosure also includes round corners and curved sides for manufacturing reasons.

Moreover, the functions of the solid-state imaging device according to the embedment and its modifications may be at least partially combined.

The above numerals are used to exemplify the entirety of the present disclosure in detail. Thus, the present disclosure is not limited to the exemplified numerals. Moreover, for example, the N-type and P-type are set for transistors and others to exemplify the present disclosure in detail. However, even if the N-type and P-type are reversely set, the same result can be achieved. Moreover, the above materials of the structural elements are used to exemplify the entirety of the present disclosure in detail. Thus, the present disclosure is not limited to the materials exemplified above. Moreover, the connections between the structural elements are used to exemplify the present disclosure in detail. Thus, connections for achieving the functions of the present disclosure are not limited to the above connections.

Furthermore, modifications obtained by making changes which those skilled in the art would conceive to the present embodiment are also included in the present disclosure unless the modifications do not depart from the scope of the present disclosure.

The herein disclosed subject matter is to be considered descriptive and illustrative only, and the appended Claims are of a scope intended to cover and encompass not only the particular embodiment disclosed, but also equivalent structures, methods, and/or uses.

INDUSTRIAL APPLICABILITY

The present disclosure is applicable to a solid-state imaging device. Moreover, the present disclosure is effectively used in, for example, a small image pickup apparatus for video shooting.

The invention claimed is:

1. A solid-state imaging device comprising:
a semiconductor substrate;
a pixel; and
a peripheral circuit at a periphery of the pixel, wherein the pixel includes:
a photoelectric conversion film which converts incident light into charges; and
a floating diffusion, in the semiconductor substrate, for holding the charges,
a non-metal contact plug connected with the floating diffusion, and
a line connected with the non-metal contact plug, the floating diffusion and the photoelectric conversion film being connected to each other via the non-metal contact plug and the line.

2. The solid-state imaging device according to claim 1, the pixel further comprising a transistor including a gate electrode and source and drain diffusion regions, the source and drain diffusion regions located in the semiconductor substrate, and
the gate electrode and the source and drain diffusion regions do not contain silicide.

3. The solid-state imaging device according to claim 2, wherein the one of the source and drain regions is the floating diffusion.

4. The solid-state imaging device according to claim 1, wherein a depth of the floating diffusion is at least a height of the gate electrode.

5. The solid-state imaging device according to claim 1, wherein a gate length of the gate electrode is has a length of 65 nm or less.

6. The solid-state imaging device according to claim 1, wherein the photoelectric conversion film includes an organic material.

7. The solid-state imaging device according to claim 1, wherein the line is directly connected with the non-metal contact plug.

8. The solid-state imaging device according to claim 1, wherein the non-metal contact plug is directly connected with the floating diffusion.

9. A solid-state imaging device comprising:
a semiconductor substrate;
a pixel; and
a peripheral circuit at a periphery of the pixel, wherein the pixel includes:
a photoelectric conversion film which converts incident light into charges; and
a floating diffusion, in the semiconductor substrate, for holding the charges,
a non-metal connector directly connected with the floating diffusion, and electrically coupled to the photoelectric conversion film.

10. The solid-state imaging device according to claim 9, the pixel further comprising a transistor including a gate electrode and source and drain diffusion regions, the source and drain diffusion regions located in the semiconductor substrate, and
the gate electrode and the source and drain diffusion regions do not contain silicide.

11. The solid-state imaging device according to claim 10, wherein the one of the source and drain regions is the floating diffusion.

12. The solid-state imaging device according to claim 9, wherein a depth of the floating diffusion is at least a height of the gate electrode.

13. The solid-state imaging device according to claim 9, wherein a gate length of the gate electrode is has a length of 65 nm or less.

14. The solid-state imaging device according to claim 9, wherein the photoelectric conversion film includes an organic material.

* * * * *